United States Patent [19]
Karner et al.

[11] Patent Number: 5,897,942
[45] Date of Patent: Apr. 27, 1999

[54] COATED BODY, METHOD FOR ITS MANUFACTURING AS WELL AS ITS USE

[75] Inventors: Johann Karner, Feldkirch, Austria; Erich Bergmann, Basel, Switzerland; Mauro Pedrazzini, Eschen, Liechtenstein; Ingrid Reineck, Huddinge; Mats E. Sjostrand, Kista, both of Sweden

[73] Assignee: Balzers Aktiengesellschaft, Balzers, Liechtenstein

[21] Appl. No.: 08/424,325

[22] PCT Filed: Oct. 28, 1994

[86] PCT No.: PCT/EP94/03562

§ 371 Date: Jun. 26, 1996

§ 102(e) Date: Jun. 26, 1996

[87] PCT Pub. No.: WO95/12009

PCT Pub. Date: May 4, 1995

[30] Foreign Application Priority Data

Oct. 29, 1993 [CH] Switzerland ............................. 3267/93
Oct. 29, 1993 [CH] Switzerland ............................. 3268/93

[51] Int. Cl.$^6$ ............................. C23C 9/00; C23C 16/26
[52] U.S. Cl. ............................. 428/216; 407/119; 57/307; 57/309; 427/249; 427/255.2; 427/307; 427/309; 427/450; 427/576; 427/578; 427/585; 428/212; 428/336; 428/457; 428/469; 428/472; 428/446; 428/697; 428/698; 428/699; 428/408
[58] Field of Search ............................. 427/249, 307, 427/309, 450; 407/119; 75/230, 238, 241; 428/408, 698, 334, 216, 336, 469, 472, 697, 699, 446, 704; 57/307, 309

[56] References Cited

U.S. PATENT DOCUMENTS

| | | | |
|---|---|---|---|
| 3,909,895 | 10/1975 | Abrahamson et al. | 29/95 A |
| 4,150,195 | 4/1979 | Tobioka et al. | 75/204 |
| 4,277,283 | 7/1981 | Tobioka et al. | 75/238 |
| 4,497,874 | 2/1985 | Hale | 428/698 |
| 4,610,931 | 9/1986 | Nemeth et al. | 75/241 |
| 4,708,037 | 11/1987 | Buljan et al. | 428/698 |
| 4,743,515 | 5/1988 | Fischer et al. | 428/698 |
| 4,820,482 | 4/1989 | Fischer et al. | 75/241 |
| 4,830,930 | 5/1989 | Taniguchi et al. | 75/230 |
| 4,843,039 | 6/1989 | Akesson et al. | 428/698 |
| 4,925,701 | 5/1990 | Jansen et al. | 427/249 |
| 4,988,421 | 1/1991 | Drawl et al. | 204/192.3 |
| 5,082,359 | 1/1992 | Kirkpatrick | 427/38 |
| 5,106,674 | 4/1992 | Okada et al. | 51/307 |
| 5,124,179 | 6/1992 | Garg et al. | 427/249 |
| 5,154,245 | 10/1992 | Waldeström et al. | 175/428 |
| 5,236,740 | 8/1993 | Peters et al. | 427/249 |
| 5,335,738 | 8/1994 | Waldenström et al. | 175/426 |
| 5,372,873 | 12/1994 | Yoshimura et al. | 428/216 |

*Primary Examiner*—Archene Turner
*Attorney, Agent, or Firm*—Notaro & Michalos P.C.

[57] ABSTRACT

In order to improve the wear resistancy—including adherence behaviour, ductility and shearing strength—at a diamond coated multiphase body, an element enrichment is applied in controlled manner in the interphase of base body and diamond layer.

42 Claims, 7 Drawing Sheets

COATED BODY, METHOD FOR ITS MANUFACTURING AS WELL AS ITS USE

TECHNICAL FIELD

The present invention relates to an at least partly coated body, comprising a substrate of a multiphase material as well as at least one diamond coating. In addition, it relates to a method for its manufacturing and uses of such body.

Appendix A belongs to the specification.

DEFINITIONS

1. Body of multiphase material

A multiphase material is a material which consists of more than one phase which phases belong either to the same compound or belong to different compounds. In the case of different compounds, the compounds may have elements in common or not. Thus, e.g. hardened steels, cermets and especially cemented carbide materials are considered as such multiphase materials.

2. Interphase

If a diamond coating is applied on a body of a multiphase material, there does not result a step-like transition from the substrate material to the diamond coating material, but a material transition along the so-called "interphase". This interphase, which may have a width of some =m, but which may also be thinner, comprises material components of the substrate material and of the diamond coating with the concentrations thereof varying when considered in a direction perpendicular to the coated surface of the body. Thus, the material composition in the interphase is neither equal to the material composition of the substrate nor to the material composition of the diamond coating.

In contrast thereto stands

3. An intermediate layer which is a layer which comprises neither the substrate material nor the diamond coating material.

4. Metalloid

Under the term "metalloid" non-metals and semi-metals, especially B, Si, Ge, S and P are understood.

Until this date, only a few methods are known for applying diamond coatings on substrate bodies of multiphase material, so that the diamond coating firmly adheres to the body. With respect to the problems encountered with such an attempt, reference is made to e.g. J. D. de Stefani, "Tooling and Production", July 1993, p. 27 ff.

An attempt for improving the adherence of diamond coatings was to provide a single-phase unitary intermediate layer, i.e. at least some atomic layers of a certain material on the surface of the substrate prior to diamond layer deposition- For example the EP-A-0 166 708 proposes to apply an adhesion improving intermediate layer on the body before applying the diamond coating. Thereby, a material is chosen which is different from the substrate material and from the diamond coating material, as is required per definition for an intermediate layer. As an intermediate layer material a metal of the groups IVb to VIb of the periodic system is used, thereby preferably Ti or a carbide, nitride, carbonitride, oxicarbide, oxide or boride of one of the said metals or a noble metal.

Further, reference is made to the EP-A-0 384 011.

Application of intermediate layers was successful with respect to the achievement of a good adhesion. However, for a good wear resistance not only a good adhesion is necessary, but also other properties, such as high ductility and a high shearing strength. The diamond coating as well as the substrate are normally optimized so as to fulfill said mechanical requirements. If, additionally, an intermediate layer is applied, this leads to significantly more complicated considerations with respect to such optimization.

Application of a metallic intermediate layer leads e.g. to a zone of significantly reduced shearing strength, so that, if such a coated body is used as a tool, especially as a cutting tool, loss of the coating will rapidly occur at the most exposed areas of the tool, as e.g. at the cutting edges. Similar effects may be observed when intermediate layers of metalloids are applied.

From the Japanese Kokai No. 5-65646 it is further known to provide a macroscopic intermediate layer of an intermetallic compound with a thickness up to 100 $\mu$m between the substrate material and the diamond coating. Thereby, the intermediate layer may be realized as a surface layer in the substrate or may be applied on the surface of the substrate. By means of such an intermediate layer, the adherence of the diamond coating is said to be improved.

It is further known from the Japanese Kokai 62-61109 or 62-61108 to make a nucleation of a diamond coating independent of the surface characteristics of the substrate, as e.g. of its roughness or degree of contamination, by adding small amounts of $AlCl_3$ or of $TiCl_4$ to the process gas. Thereby diamond coatings are deposited on substrates which would not be deposited without the said elements admixed. These references obviously treat diamond coating problems of one-phase and of multiphase material substrates equally, as directed on solution of a nucleation problem at substrates of different surface characteristics. They are not directed to the problem of increasing the wear resistance. Wear resistance is clearly not a problem e.g. at diamond coated silicon substrates as treated in these references. This because silicon is a single-phase material and clearly not a substrate material which would be considered as optimized for high wear resistance requirements.

It is further known, e.g. from the EP-A-0 519 587, to chemically etch the substrate surface before application of a diamond coating. A drawback of this technique is the increased brittleness of the substrate surface and the difficulties of accurately controlling the etching process. For substrate materials with a considerable Co-content it is further known, e.g. from the U.S. Pat. No. 4,843,039, to deplete the surface of the substrate with respect to Co before coating with diamond.

SUMMARY OF THE INVENTION

It is the object of the present invention to provide a body of the above mentioned kind, the wear resistance of which, i.e. the combination of in particular adhesion, shearing resistance and ductility, is essentially improved.

So as to realize this, the above mentioned body is characterized by the fact that in the interphase an element enrichment is provided with a concentration that is higher than the concentration of the same element at a likewise diamond coated equal body where an enrichment with the element has not been provided. If the enrichment element is neither an element of the body material nor an element of the diamond coating, then the inventively applied concentration of this element is by definition higher than the concentration of this element at a likewise diamond coated identical body where such an element would not occur. If the enrichment element is an element which is already part of the body material and/or of the diamond coating material, the inventively realized enrichment may be recognized by comparison of the inventively provided concentration distribution of the element considered, with that of a coated equal body, which has been equally diamond coated, but without any enrichment activities.

It was thus recognized that the wear resistance, i.e. the combination of in particular adherence, shearing resistance and ductility of the mentioned diamond coated, multiphase body, is significantly increased in that an element enrichment is realized in the interphase with a concentration which is in at least one place within the interphase higher than such element concentration at an equal body which has equally been diamond coated, but for which no element enrichment has been provided.

Since no intermediate layer is provided between the substrate and the diamond coating, in contrast to prior art approaches, but the interphase is selectively modificated, it is believed that not only the adherence characteristics, but additionally the wear resistance in terms of shearing resistance and ductility are positively influenced or at least not negatively influenced.

In a preferred embodiment, the thickness of the diamond coating is less than 50 $\mu$m, preferably within the range of 2 $\mu$m to 30 $\mu$m, both limits included.

Further, the inventively coated body in one embodiment is characterized by a nucleation density of the diamond coating which is essentially uninfluenced by the element enrichment equal to the nucleation density at an equally diamond coated equal body, for which body no element enrichment was provided and which serves as comparison basis.

The thickness of the interphase is in the range of a few $\mu$m, is preferably less than 15 $\mu$m, is most preferably less than 10 $\mu$m.

The concentration distribution of the enrichment element may be at least essentially constant along a substantial part of the interphase and may thereby be equal to the concentration of this element in the body material, if the body material comprises this element at all. Especially if the body material does not comprise the said enrichment element, the enrichment element concentration may first rise and then be kept essentially constant along a substantial part of the interphase. Preferably, however, at least one maximum peak of the enrichment element concentration is present within the interphase.

Moreover it has turned out that the aimed effect of the invention, i.e. improvement of wear resistance of a diamond coated substrate of a multiphase material, is particularly well realized if, according to the wording of claim 6, the concentration of the enrichment element is at least higher by an amount of 0.01 at % than the concentration of that element at an equally diamond coated equal body without enrichment, said concentration being preferably higher by 0.05 at %, even more preferably higher by 0.5 at % and most preferably higher by 1 at %.

A further optimized wear resistance is realized in that the maximum concentration of the enrichment element within the interphase is at most 50 at % higher than the concentration of that element in the interphase at an equally diamond coated equal body without element enrichment. Thereby, preferably, the said maximum concentration is in the range of 2 at % to 20 at % (both limits included) higher than the concentration of that element at an equally coated equal body without element enrichment.

As the enrichment element, at least one of the metals Mg, Al, Cu, but preferably Al, or the metalloids B, Si, Ge, S, P have been found to be most suited, provided as a component of the enrichment element or as the enrichment element itself.

In a preferred embodiment, the substrate comprises as an essential component one or more than one carbide and cobalt in a uniformly distributed mixture. In a further preferred embodiment and in combination with the inventive element enrichment at the interphase, the zone adjacent to the surface of the substrate may be depleted in cobalt. In a most preferred embodiment, the cobalt depletion zone is combined with a zone of cobalt enrichment, said zone following the cobalt depletion zone when considered in a direction towards the inside of the body.

The element enrichment is at least to a part provided simultaneously with diamond deposition.

Thereby, in one and the same reaction vessel the enrichment is provided either just before the start of diamond deposition process and is then led continuously and without process interruption into the diamond deposition process, or the element enrichment is provided simultaneously with the diamond deposition process.

A preferred procedure is to provide the element enrichment just before the start and during the beginning or only during the beginning of the diamond deposition process.

It should here be mentioned that essentially all known processes for diamond coating may be used as described in e.g. "Development of CVD-Diamond Synthesis Techniques", S. Matsumoto, p. 50–58; Proceeding of First International Symposium on Diamond and Diamond-like Films, Proc. Vol. 89–12; The Electrochemical Society, 1989, edit. by J. P. Dismukes.

A relatively simple controlling of the element enrichment process and of the composition of the interphase is reached in that the element enrichment is realized from the gaseous phase, preferably from a metallorganical or a metalloidorganical gas phase. In principle known vacuum coating processes as CVD-processes, PVD-processes or PECVD-processes (plasma enhanced chemical vapor deposition) are however suited for realizing the element enrichment.

In a preferred realization form, the element enrichment is realized by a PVD-process which preferably comprises evaporation, e.g. electron beam evaporation, or by a plasma-chemical reaction with a solid body, most preferably simply a solid body of a ceramic material, from which at least one element is released in gaseous form into the process atmosphere by plasma chemical reaction.

Besides the PVD-processes, plasma-chemical reaction processes are well suited, too, to provide the inventive enrichment element. Said plasma-chemical reaction may comprise e.g. the decomposition of metallorganical or metalloidorganical gases, but may also comprise the reaction of atomic hydrogen with a ceramic solid body, said atomic hydrogen being customarily present in the process atmosphere during the diamond coating.

A further preferred variant of the inventive method comprises the selection of a body, the material of which comprising one or more than one carbide and cobalt. In a further preferred embodiment, the surface zone of the body is depleted from cobalt before application of the diamond coating and before enrichment with the element, said depletion being realized by sintering or by a chemical etching process. The cobalt depletion at the surface of the body may be realized, as described above, by a metallurgical sintering method, whereby the depth of the depletion zone into the body will be 5 $\mu$m to 50 $\mu$m and will lie in a preferred embodiment in the range of 10 $\mu$m to 20 $\mu$m. The cobalt depletion zone resides in the body and not in the interphase.

In a most preferred embodiment the body comprises a Co-depletion zone of 5 $\mu$m to 50 $\mu$m thickness (both limits included), preferably of 10 to 20 $\mu$m, combined with a cobalt enrichment zone following the depletion zone when considered in a direction towards the inside of the body, said enrichment zone preferably being 50 to 500 µm thick, most preferably 50 to 150 µm thick (all limit values included). In the cobalt enrichment zone the cobalt concentration is higher than in the binder phase of the original, unmodified body material.

If the above mentioned cobalt depletion is realized by a chemical etching process, the depletion zone is preferably thinner than 10 µm, most preferably thinner than 5 µm. This again considered without the interphase.

With respect to an especially preferred method for the deposition of the diamond coating, we refer to the EP-A-0 478 909, which as Appendix A forms part of the present description.

The element enrichment in the interphase is preferably realized in that, at least to a part during the diamond coating, the enrichment element is evaporated and its concentration in the process atmosphere is open-loop controlled or negative feedback controlled by adjusting the evaporation power at an evaporation source, as e.g. at an electron beam evaporator for the element as an adjusting member in the negative feedback control loop or as an open-loop adjusting member.

In a further preferred variant of the inventive manufacturing method, the enrichment element is introduced into the process atmosphere through a plasma-chemical reaction with a solid body, at least partly during the diamond coating process, and the concentration of the enrichment element in the atmosphere is open-loop controlled or negative feedback controlled, whereby the power of the plasma discharge and/or the gas composition in the process atmosphere is adjusted.

For the control of the enrichment element concentration in the process atmosphere, said entity can be measured by means of emission spectroscopy, where the output signal of the spectrometer is used as actual value in a negative feedback control loop. Alternatively, the output signal is used as a check value for the momentary concentration of the element in the process atmosphere in an open-loop concentration control. The inventively coated body is especially suited as a tool, especially as a chip forming tool, as e.g. for turning, milling or drilling. Such bodies are especially suited for machining of non-ferrous metals, as e.g. of aluminum alloys or of brass or bronze, and of non-metals, as e.g. of plastic materials, wood or composite materials. Further, the inventive bodies are most suited as components with a high wear resistance, especially with a high abrasion resistance.

In analogy, the inventive method is especially suited for the production of wear resistant bodies.

The present invention will be described by means of figures and examples, additionally to the description of its most important aspects which are also defined in the claims.

Figure 1:
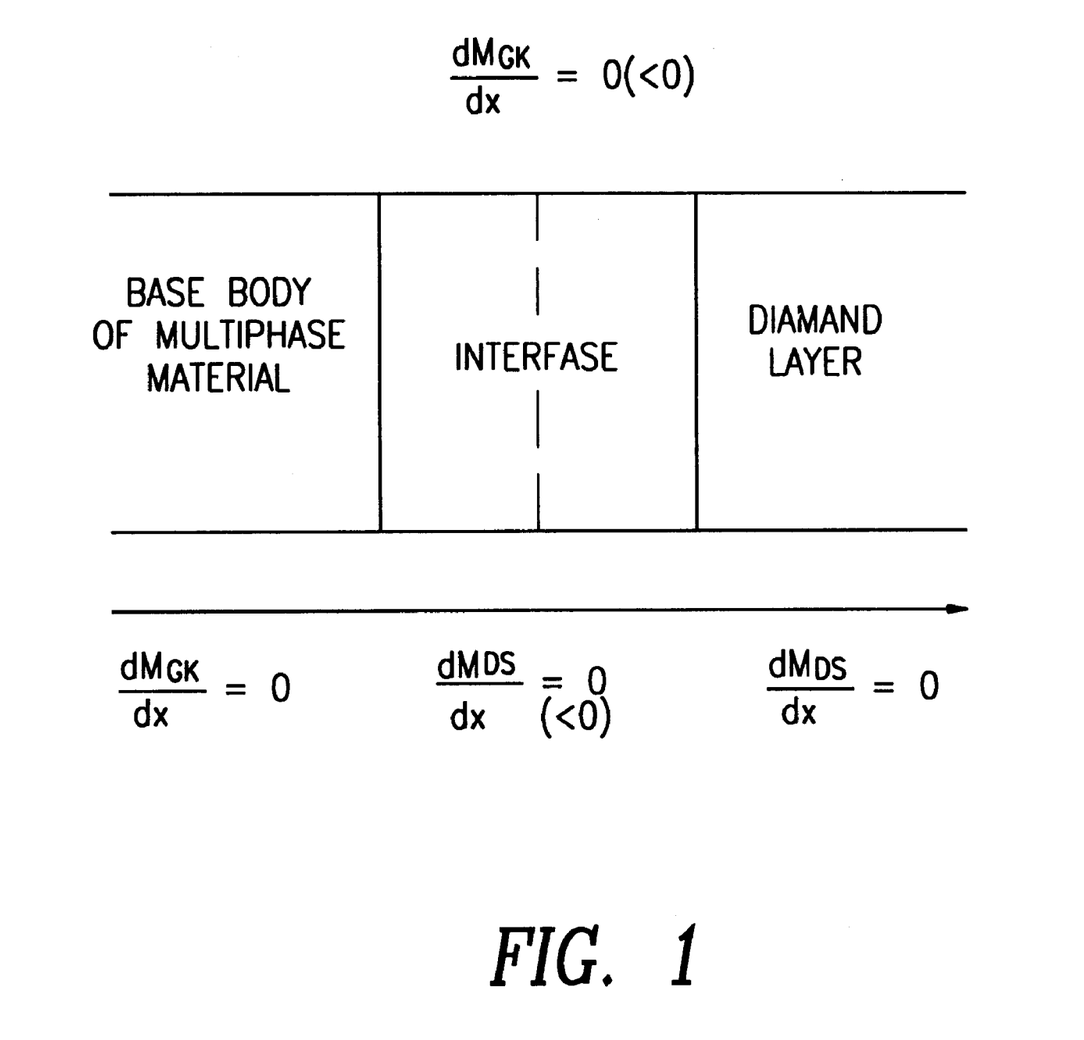
FIG. 1 is a schematic drawing of a body, interphase and diamond coating for explaining the interphase term.

FIG. 1 shows schematically the conditions present at a diamond coated multiphase body for the inventive element enrichment as well as for a conventional diamond coating without enrichment. Considered from the inside of the body towards its outside, as shown with the direction x, the composition of the substrate material $M_{GK}$ does clearly not vary within the body, which is shown in FIG. 1 by the derivative $dM_{GK}/dx \sim 0$. In analogy and again as viewed in the x direction, the material composition of the diamond coating does not change as shown in FIG. 1 by the derivative $dM_{DS}/dx \sim 0$.

In the interphase therebetween, the material composition changes principally continuously from that of the substrate material into that of the diamond coating. Thus, still considered in direction x according to FIG. 1, in the interphase, the body material derivative $dM_{GK}/dx \neq 0$ and the derivative $dM_{DS}/dx \neq 0$.

Thereby, these conditions need not to be fulfilled altogether everywhere along the interphase, it is sufficient if one of said two conditions is fulfilled. Generally spoken and still considered in said x direction and as shown in FIG. 1 in brackets, the concentration of the body material $M_{GK}$ or at least of one significant component of that material will decrease along the interphase and the content of diamond coating material $M_{DS}$ will increase along the interphase, still considered in the x direction.

Thus, the result is generally, as shown in FIG. 1 by the dashed lines, an interphase zone adjacent to the substrate, where the body material is predominant, and an interphase zone adjacent to the diamond coating, where the diamond coating material is predominant.

With a method and an apparatus as disclosed in the EP-A-0 478 909, which forms part of the present description as Appendix A, cemented carbide cutting turnover inserts, their main components being tungsten carbide and cobalt, were diamond coated with the inventive element enrichment in the interphase. In this case, aluminum was used as the enrichment element.

The realization of the element enrichment may e.g. be made by reaction of the atomic hydrogen in the process atmosphere with a solid body of ceramic disposed in the reactor. The enrichment element is thereby released in gaseous phase into the atmosphere and is built into the interphase simultaneously with diamond coating deposition. Hereto the element is especially released just before and/or during the starting phase of diamond deposition process.

Instead of using the said etching reaction of a ceramic solid body disposed within the reactor, the element enrichment may as well be realized by every other PVD-process, as e.g. by means of thermal evaporation, electron beam evaporation, arc evaporation or by means of cathode sputtering. The element enrichment may also be provided through a plasma-chemical reaction with a gaseous compound of the enrichment element, as e.g. with a metallorganical or a metalloidorganical compound.

In order to control the enrichment element concentration in the gaseous phase, at least to a part simultaneously with deposition of the diamond coating, emission spectroscopy is preferably employed for the measurement of the concentration of the enrichment element in the gas phase of the process atmosphere. The emission spectroscopy measuring result is applied as a measured rated value signal in a negative feedback control loop for the concentration of the element in the process atmosphere.

Depending on the selected method to release the enrichment element into the process atmosphere, the releasing rate of the element is thereby used as an adjusted entity in the negative feedback control loop. Nevertheless, it is also possible to use the measured, instantaneous concentration of the enrichment element in the process atmosphere as a check value for an open-loop concentration control to follow a predetermined concentration profile over time.

Figure 5:
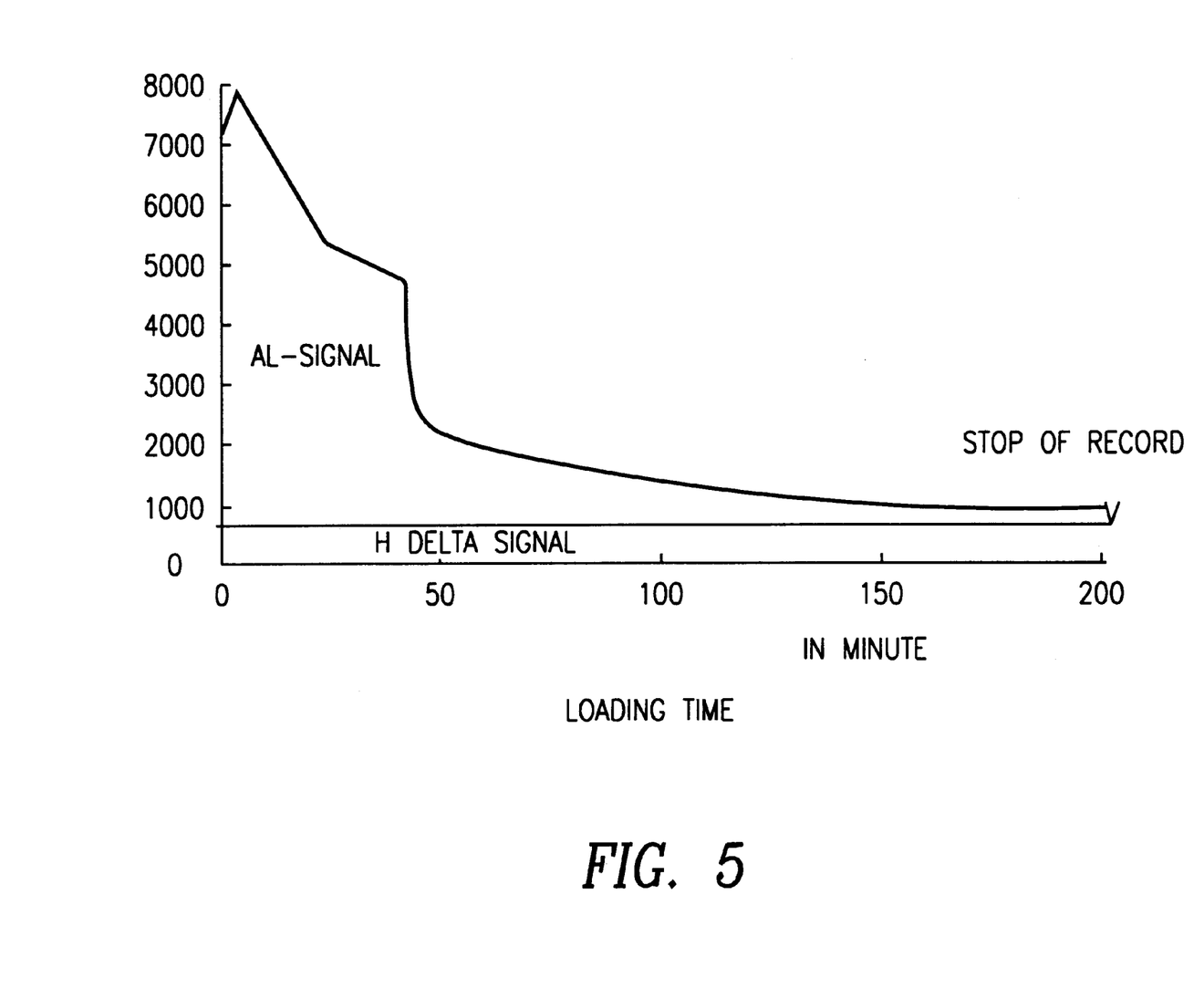
FIG. 5 is a graph showing the variation by time of the relative aluminum vapor concentration during the first three hours in the process atmosphere for an overall diamond coating timespan of 10 hours. The curve thereby shows a relative emission intensity of the aluminum line and, as a reference signal, of a hydrogen line.

FIG. 5 shows the changes over time of the negative feedback controlled or open-loop controlled concentration course of the enrichment element, e.g. of aluminum. For comparison, the course of the hydrogen concentration is additionally shown. It may be seen that the element enrichment according to the invention and as shown as an example is essentially provided during the first hour of the deposition process with an overall diamond deposition duration of ten hours.

Using the diamond deposition method as described in Appendix A, different bodies were diamond coated. The following process parameters were used:

Total pressure: 100 Pa

Total discharge current: 700 A

Gas mixture: $Ar/H_2/CH_4=1:1:0.005$

Body temperature: 810° C.

In the following table are listed the different bodies with indication of their pretreatment, whether the inventive element enrichment was provided or not and, additionally, the resulting wear resistance behaviour.

| Exper. No. | Substrate | Pretreatment | Modification | Wear Character |
|---|---|---|---|---|
| DiD 73 | WC-Co 6% | Co-depletion by sintering | Al-enrichment | 170 |
| DiD 163 | WC-Co 6% | Co-depletion by sintering | Al-enrichment | 170 |
| EID 66 | WC-Co 6% | Co-depletion by sintering | none | 10 |
| DiD 53 | WC-Co 3% | chem. etching | none | 0 |
| DiD 169 | WC-Co 3% | chem. etching | Al-enrichment | 170 |
| EID 92a) | WC-Co 3% | none | Al-enrichment | 170 |
| EID 92b) | WC-Co 6% | none | Al-enrichment | 170 |
| EID 92c) | WC-Co 6% | sand blasting | Al-enrichment | 170 |

The substrate bodies are turnover cutting tool inserts. All coated bodies, i.e. those labelled DiD 73, 163, 169. and EID 92a), b) and c), and those manufactured using conventional diamond coating processes, i.e. without realization of the inventive element enrichment, labelled EID 66 and DiD 53, were all subjected to the same milling test.

Figure 6:
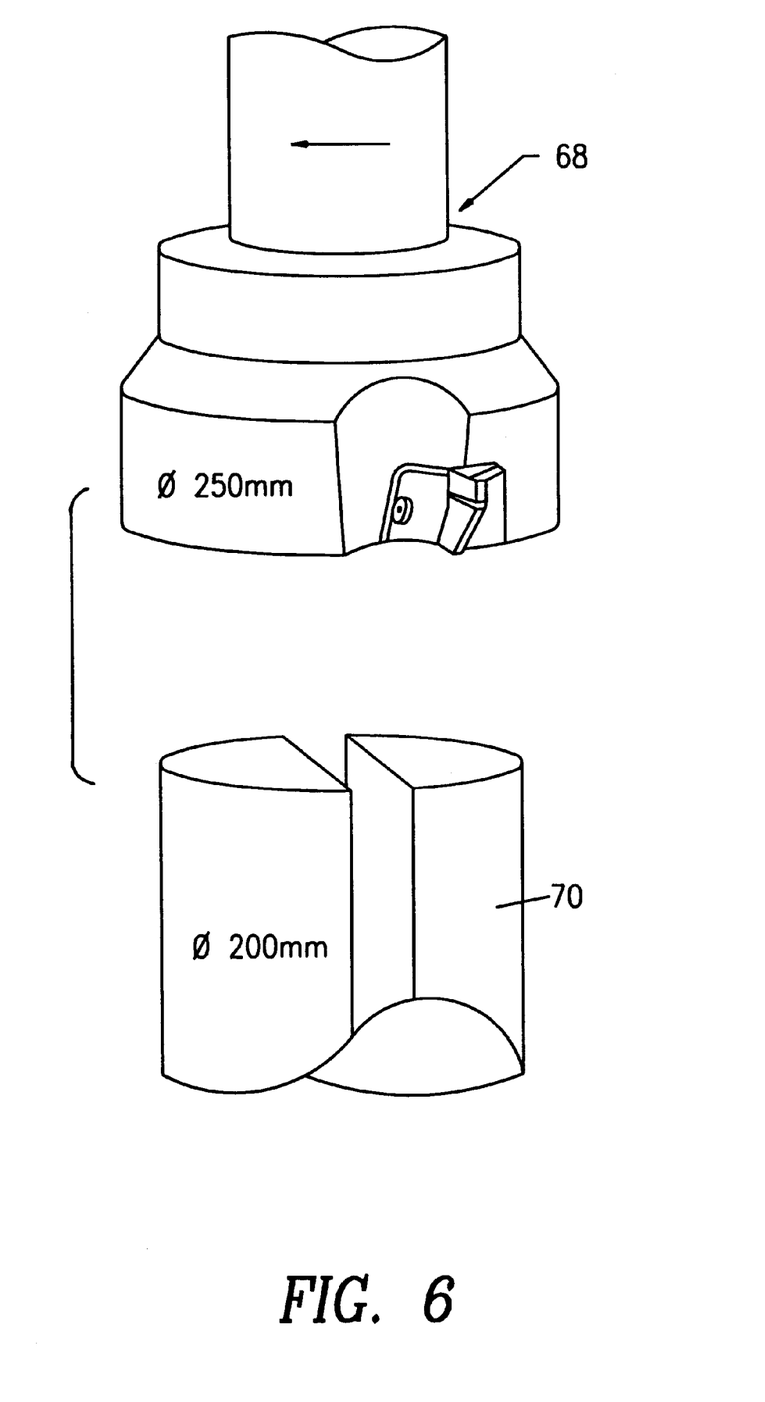
FIG. 6 a schematic representation for explaining the tests performed at the inventively and non-inventively coated bodies for determining and comparing their wear resistance.

The conditions during the performed milling test are shown in FIG. 6 with a milling head 68 and a machined workpiece 70. This milling test is especially suited to determine the wear resistance of tools. In the milling test the following parameters were used:

Material of the workpiece 70: Al-4% Cu 0,8% Si

Workpiece shape: Cylinder with diameter 200 mm

Cutting speed: 1500 m/min

Depth of cut: 1 mm

Feed: 0,1 to 0,5 mm/min

Tested tool: one turnover cutting plate.

The number which is listed in the above table under the heading "wear characteristic" represents the number of single completed face milling passes at the cylinder. For good turnover plates the test was terminated after 170 milling operations. For a more detailed description of the milling test, attention is drawn to "CVD-Diamantbeschichtete Zerspanwerkzeuge", (CVD-diamond coated cutting tools), I. Reineck, S. Söderberg and M. E. Sjöstrand, VDI-Gesellschaft Produktionstechnik, Neuentwicklungen in der zerspanungstechnik, p. 55–70, Dusseldorf, 22.–24.9.93.

The results of the wear characteristic tests in the form of the number of performed passes may clearly be seen in the above table. Whereas without realizing the described inventive element enrichment, according to the experiment EID 66 and EID 53, already after zero or ten passes respectively, the diamond coating chipped off, the cutting tools which were diamond coated according to the present invention could stand 170 passes up to terminating the test. This is valid not only for bodies with cobalt-depleted surface realized by chemical etching (EID 169) or by sintering (EID 163), but also for not pretreated (EID 92a), b) or for sand blasted (EID 92c) body surfaces.

Figure 2A:
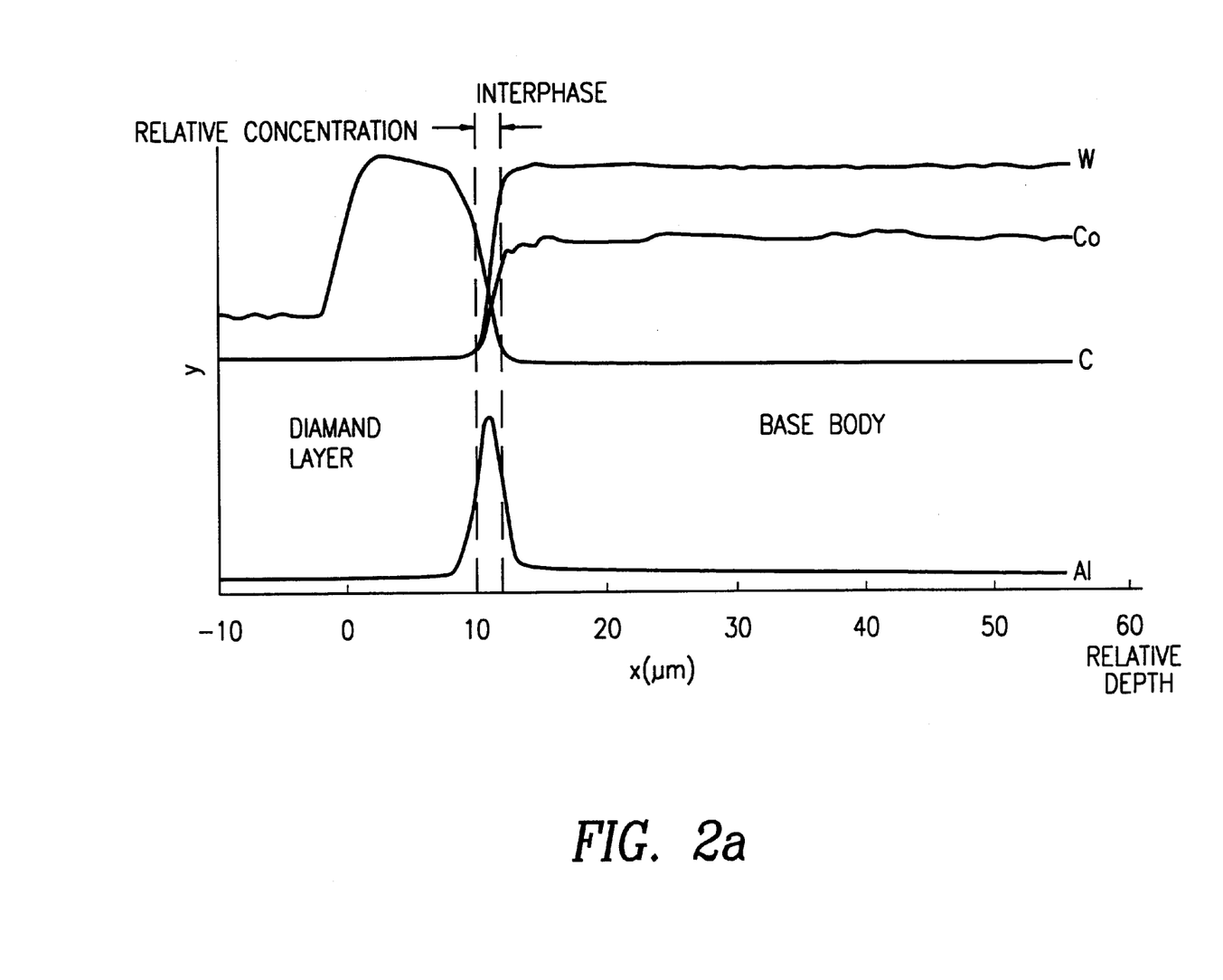
FIG. 2a is a graph showing a commercially available multiphase material body with inventive aluminum enrichment in the interphase, the qualitative courses of the concentrations of the enrichment element aluminum in the interphase as well as of body material and diamond coating material elements Co, W and C, measured by means of electron probe micro analysis EPMA.
Figure 2B:
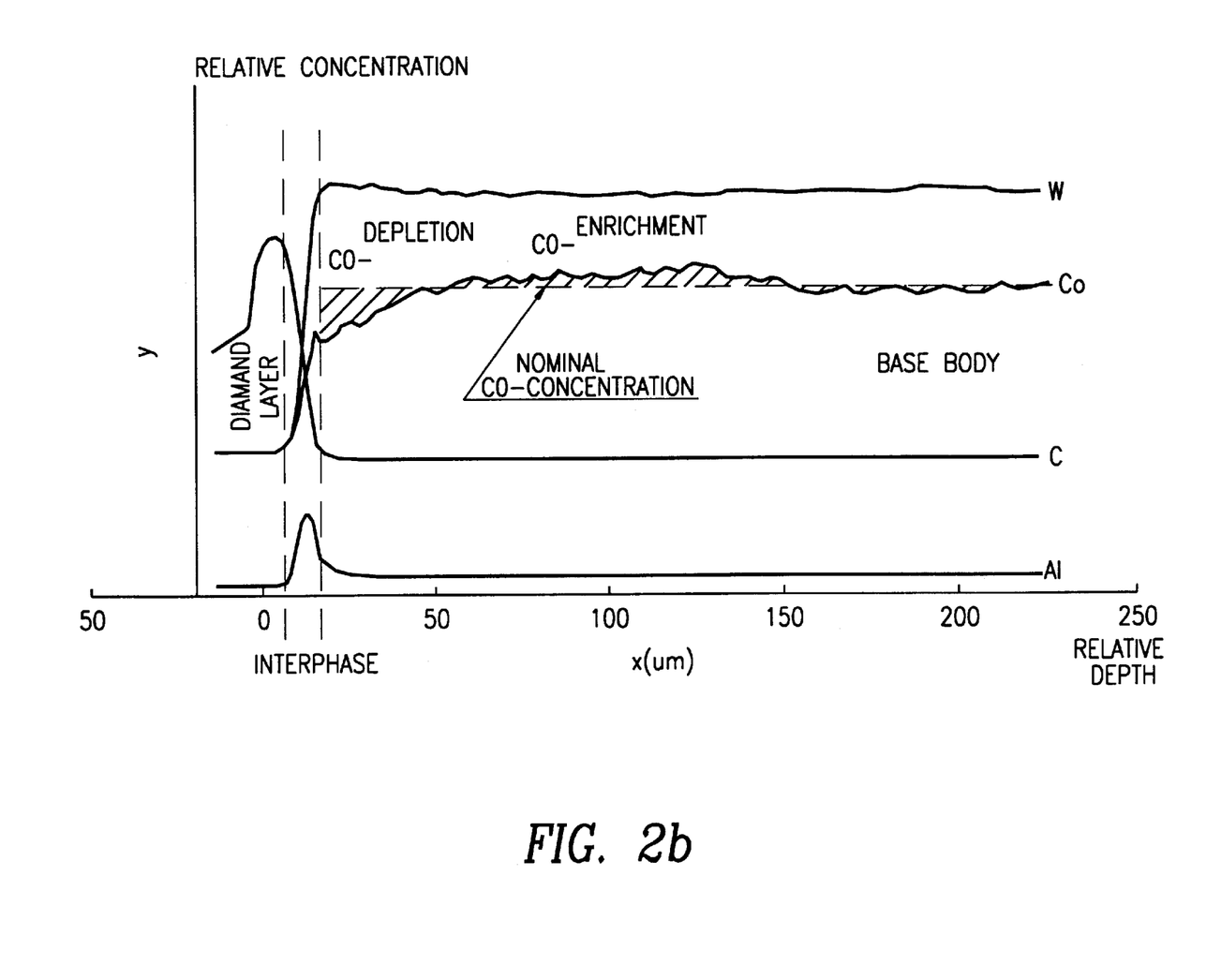
FIG. 2b is a graph showing the element concentrations in analogy to FIG. 2a at a commercially available body, but inventively diamond coated with a cobalt depletion and a cobalt enrichment body zone under provision of an aluminum enrichment in the interphase.

FIG. 2a shows the qualitative aluminum enrichment measured by means of EPMA at an inventive realization of the element enrichment for a commercial cemented carbide body without cobalt depletion, so e.g. according to the experiments EID 92a), 92b). In analogy, FIG. 2b shows the aluminum enrichment at a Co-depleted body additionally with Co-enrichment zone, e.g. according to the experiments DID 73, 163, 169. In both cases there is clearly recognized a maximum of the aluminum concentration within the interphase. Again, it must be stated that the further course of concentration of the enrichment element outside the interphase, i.e. into the body and/or into the diamond coating, is not relevant for inventively reaching the high wear resistance.

Figure 3:
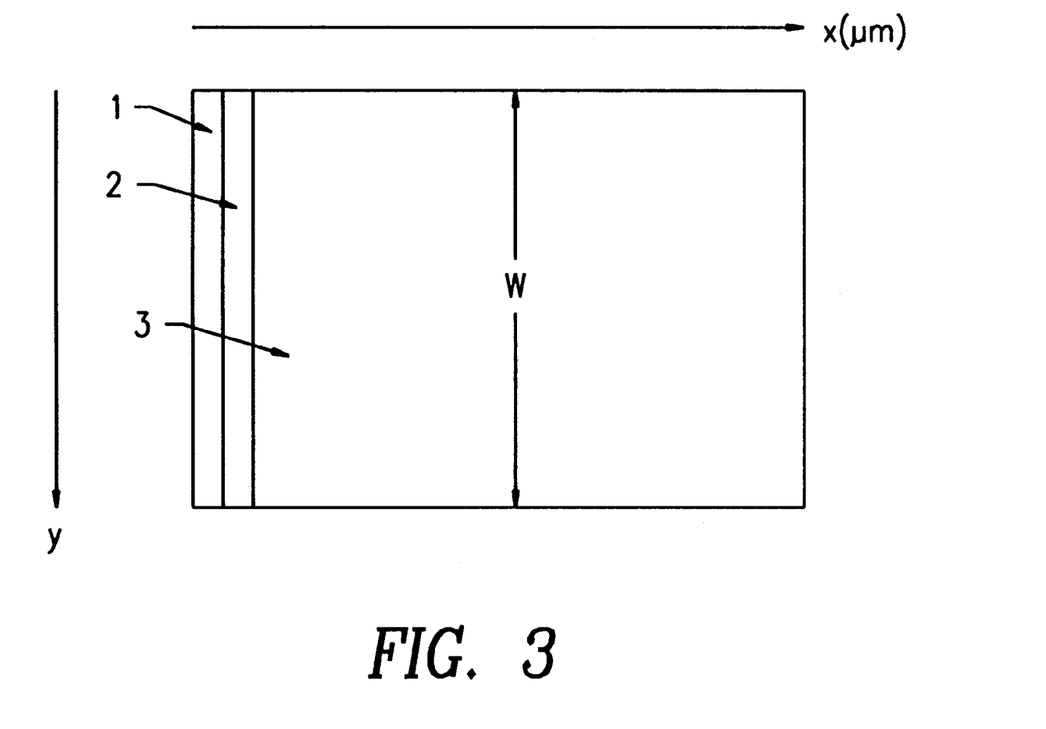
FIG. 3 is a schematic drawing for the definition of the beam width for the EPMA measurement according to FIGS. 2a and 2b.

FIG. 3 schematically shows the measuring operation for measuring according to FIG. 2. The reference number 1 depicts the diamond coating, 2 the interphase and 3 the body. The square area represents the area being analyzed, whereby the analyzing beam with a width w in y-direction of 250 $\mu$m is scanned in the x-direction.

Figure 4A:
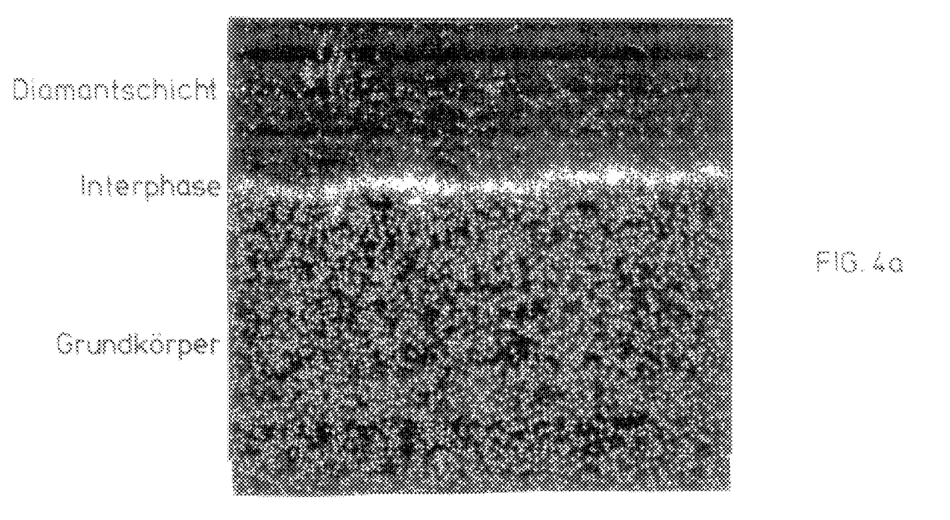
FIG. 4a shows an inventively diamond coated body with aluminum enrichment in the interphase, which coated body being also the base of the measurement according to FIG. 2a, the qualitative distribution of the Al-concentration at a cross section across diamond coating, interphase and body and performed by EPMA.

FIG. 4a shows the aluminum distribution measured by EPMA of a cross section of the diamond coating, interphase and body, e.g. according to the concentration distribution as shown in FIG. 2b. The enrichment of the enrichment element, namely aluminum, in the interphase is clearly recognized.

Figure 4B:
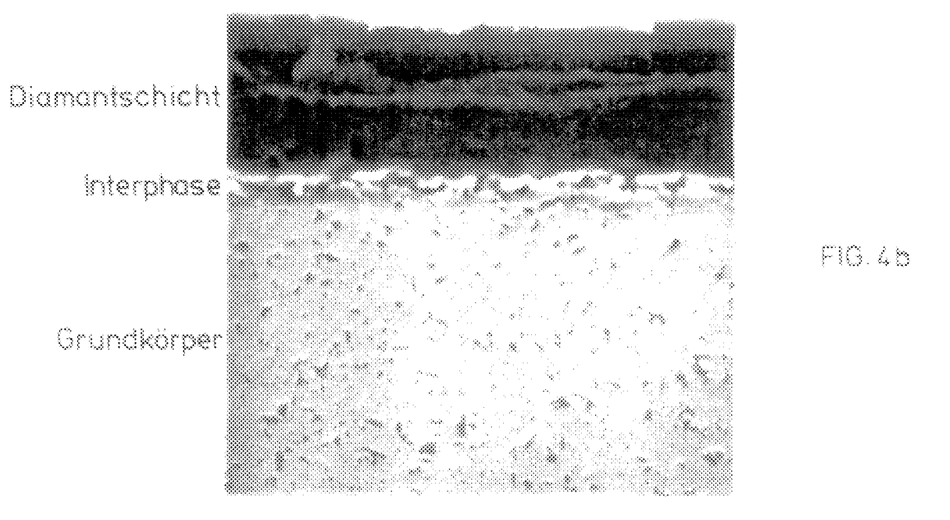
FIG. 4b is a scanning electron microscope image of the cross section according to FIG. 4a across body, interphase and diamond coating with an enlargement factor of 2000.

FIG. 4b shows the corresponding scanning electron microscope image of the cross section of body, interphase and diamond coating.

We claim:

1. A coated body comprising:
   a base body made of a multi-phase material;
   a diamond coating on at least a portion of the base body;
   an interphase region, formed between the diamond coating and the base body, in which the concentration of the multi-phase material of the base body diminishes substantially steadily in a direction from the base body toward the diamond coating, while the concentration of the diamond coating correspondingly rises substantially steady; and
   an element contained in the interphase region having a concentration with a peak in the interphase region, the concentration of the element diminishing substantially steadily from the peak toward the base body and the diamond coating.

2. The coated body according to claim 1, wherein the thickness of the diamond coating is less than 50 $\mu$m.

3. The coated body according to claim 1, wherein the thickness of the diamond coating is between 2 $\mu$m and 30 $\mu$m, inclusive.

4. The coated body according to claim 1, wherein the thickness of the interphase region is at least 1 $\mu$m.

5. The coated body according to claim 1, wherein the thickness of the interphase region is no greater than 15 $\mu$m.

6. The coated body according to claim 1, wherein the thickness of the interphase area is no greater than 10 $\mu$m.

7. The coated body according to claim 1, wherein the element comprises at least one of magnesium (Mg), aluminum (Al), and copper (Cu).

8. The coated body according to claim 1, wherein the element consists of aluminum (Al).

9. The coated body according to claim 1, wherein the element comprises at least one of boron (B), silicon (Si), germanium (Ge), sulfur (S), and phosphorus (P).

10. The coated body according to claim 1, wherein a compound having the general formula $AlCo_xC_y$ is provided in the interphase region.

11. The coated body according to claim 10, wherein the interphase region is composed of an interphase material and the compound comprises a majority of the interphase material.

12. The coated body according to claim 1, wherein the multi-phase material of the base body comprises at least one carbide and cobalt (Co), the at least one carbide and cobalt in an equally distributed mixture.

13. The coated body according to claim 12, wherein a first area adjacent the diamond coating and within the base body has less cobalt than the remaining base body.

14. The coated body according to claim 13, wherein a second area adjacent the first area and toward the base body is cobalt enriched with respect to the remaining base body.

15. A coated body according to claim 14, wherein said first area has a thickness of 5 to 50 $\mu$m.

16. A coated body according to claim 15, wherein said thickness is between 10 and 20 $\mu$m.

17. A coated body according to claim 14, wherein said second area has a thickness between 50 and 500 $\mu$m.

18. A coated body according to claim 17, wherein said thickness is between 50 and 150 $\mu$m.

19. A coated body according to claim 14, wherein the cobalt concentration in said second area is greater than the cobalt concentration of the base body material.

20. A method for manufacturing a coated body comprising:
   providing a base body composed of a multi-phase material;
   directly depositing a diamond coating on the base body, thereby forming an interphase region composed of an interphase material in which the concentration of the multi-phase material of the base body diminishes substantially steadily in a direction from the base body toward the diamond coating, while the concentration of the diamond coating correspondingly rises substantially steadily; and
   adding an element to the interphase material, such that the element has a concentration with a peak in the interphase region and decreases substantially steadily from the interphase region toward the base body and from the interphase region toward the diamond coating.

21. The method according to claim 20, wherein the element is added out of a gaseous phase.

22. The method according to claim 21, wherein the the gaseous phase comprises a metallorganic or metalloidorganic gas.

23. The method according to claim 20, wherein the element is added by physical vapor deposition.

24. The method according to claim 23, wherein the physical vapor deposition comprises evaporation of a solid material.

25. The method according to claim 24, wherein the evaporation is electron beam evaporation.

26. The method according to claim 20, wherein the element is added by a plasma chemical reaction with a solid body.

27. The method according to claim 26, wherein the solid body is a ceramic containing the element, and the element is freed from the ceramic into a process atmosphere for diamond coating by the plasma chemical reaction.

28. The method according to claim 20, further comprising selecting as the multi-phase material at least one carbide and cobalt, and depleting cobalt from a depletion area of the base body adjacent a surface of the base body for being diamond coated before beginning depositing the diamond coating.

29. The method of claim 28, further comprising producing a cobalt-enriched region within said base body adjacent the depletion area and toward the interior of the base body.

30. The method according to claim 20, wherein during at least a part of depositing the diamond coating, the element is evaporated and the concentration of the element within a diamond coating process atmosphere is one of open loop and negative feedback closed-loop controlled by adjusting the evaporation rate of a controllable evaporation source of the element.

31. The method according to claim 30, wherein the concentration of the element in the diamond coating process atmosphere is monitored by measuring emission spectroscopy and the result of the measuring is one of compared as a controlled value in a negative feedback control loop with a rated value for the concentration of the element, and exploited for open loop control indication of the concentration of the element in the diamond coating process atmosphere.

32. The method according to claim 20, wherein during at least a part of depositing the diamond coating, the element is added by plasma chemical reaction with a solid body in a diamond coating process atmosphere, and the concentration of the element is one of open loop and negative feedback closed-loop controlled by adjusting at least one of the power of a plasma discharge and the gas composition of the diamond coating process atmosphere.

33. The method according to claim 32, wherein the concentration of the element in the diamond coating process atmosphere is monitored by measuring emission spectroscopy and the result of the measuring is one of compared as a controlled value in a negative feedback control loop with a rated value for the concentration of the element, and exploited for open loop control indication of the concentration of the element in the diamond coating process atmosphere.

34. The method according to claim 20, wherein the concentration of the element is substantially constant between the base body and the diamond coating in a substantial portion of the interphase region.

35. The method according to claim 20, wherein the element is added to the interphase material such that the concentration of the element in the interphase material is at least 0.01 at % higher than the concentration of the element in the interphase material before the element is added.

36. The method according to claim 35, wherein the element is added such that the concentration of the element is at least 0.05 at % higher.

37. The method according to claim 36, wherein the element is added such that the concentration of the element is at least 1 at % higher.

38. The method according to claim 20, wherein the element is added to the interphase material such that the concentration of the element is no greater than 50 at % higher than the concentration of the element in the interphase material before adding the element.

39. The method according to claim 38, wherein the element is added such that the concentration of the element in the interphase material is between 2 at % and 20 at %, inclusive, higher.

40. A coated wear-resistant device or tool manufactured according to the process of claim 20.

41. A coated cutting tool manufactured according to the process of claim 20.

42. The method according to claim 20, wherein adding said element is performed within the same reactor one of just before starting depositing the diamond coating, followed by transiting without interruption to depositing the diamond coating, and depositing said diamond coating simultaneously.

* * * * *